(12) United States Patent
Toyoda (10) Patent No.: US 8,440,493 B2
(45) Date of Patent: May 14, 2013

(54) SOLID-STATE IMAGING APPARATUS AND MANUFACTURING METHOD THEREOF

(75) Inventor: Takehiro Toyoda, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 693 days.

(21) Appl. No.: 12/416,228

(22) Filed: Apr. 1, 2009

(65) Prior Publication Data

US 2009/0251573 A1    Oct. 8, 2009

(30) Foreign Application Priority Data

Apr. 4, 2008 (JP) ................................. 2008-098166

(51) Int. Cl.
*H01L 31/0232* (2006.01)
*H01L 33/08* (2010.01)

(52) U.S. Cl.
USPC .................................. 438/70; 438/65; 438/69

(58) Field of Classification Search ............ 438/65, 438/70
See application file for complete search history.

(56) References Cited

U.S. PATENT DOCUMENTS

| 7,364,933 B2 * | 4/2008 | Kim ................................. 438/65 |
| 7,382,011 B2 | 6/2008 | Noda et al. |
| 7,679,117 B2 | 3/2010 | Noda et al. |
| 2005/0029433 A1* | 2/2005 | Sakoh et al. ............... 250/208.1 |
| 2006/0183265 A1 | 8/2006 | Oh et al. .......................... 438/65 |
| 2007/0145419 A1 | 6/2007 | Park ............................... 257/223 |
| 2008/0054388 A1* | 3/2008 | Nakata et al. ................. 257/432 |
| 2008/0203509 A1 | 8/2008 | Mishima et al. |

FOREIGN PATENT DOCUMENTS

| JP | 2000-150846 A | 5/2000 |
| JP | 2001-339059 A | 12/2001 |
| JP | 2004-186407 A | 7/2004 |
| JP | 2006-229206 A | 8/2006 |
| JP | 2006-286873 A | 10/2006 |
| JP | 2007-013061 A | 1/2007 |
| JP | 2007-180541 A | 7/2007 |
| JP | 2008-210868 A | 9/2008 |
| JP | 2008-270423 A | 11/2008 |
| JP | 2009-146957 A | 7/2009 |

* cited by examiner

Primary Examiner — Telly Green
Assistant Examiner — Pamela E Perkins
(74) Attorney, Agent, or Firm — Fitzpatrick, Cella, Harper & Scinto (57) ABSTRACT

A solid-state imaging apparatus and a manufacturing method of a solid-state imaging apparatus are provided. Metal wirings 102 and 103 are formed in an effective pixel region A and out-of effective pixel region B of a semiconductor substrate 100, and an etch stop layer 118 is formed over the metal wirings 102 and 103. Moreover, an insulating film 119 is formed on the etch stop layer 118, and another metal wiring 104 is formed on the insulating film 119 in the out-of effective pixel region B. Next, the insulating film 119 in the effective pixel region A is removed by using the etch stop layer 118, and interlayer lenses 105 are formed in the step in the effective pixel region A where the insulating film 119 is removed.

10 Claims, 7 Drawing Sheets

SOLID-STATE IMAGING APPARATUS AND MANUFACTURING METHOD THEREOF

BACKGROUND OF THE INVENTION

1. Field of the Invention

The present invention relates to a solid-state imaging apparatus and a manufacturing method thereof, and particularly to a solid-state imaging apparatus equipped with interlayer lenses and a manufacturing method thereof.

2. Description of the Related Art

In recent years, an amplifying type image sensor, such as a charge coupled device (CCD) image sensor and a complementary metal oxide semiconductor (CMOS) image sensor, has been used for an image inputting apparatus, such as a digital camera, a video camera, and an image reader. At that time, as a higher performance solid-state imaging apparatus, the amplifying type image sensor including an increased number of photoelectric conversion elements by reducing the areas of the photoelectric conversion elements thereof performing photoelectric conversions and a further reduced chip size has been desired.

If the areas of the photoelectric conversion elements are reduced, then the quantity of receivable light lessens and the sensitivity of the image inputting apparatus lowers as the areas of the light receiving surfaces of the photoelectric conversion elements decrease. As a measure of the sensitivity lowering, the technique of forming on-chip micro lenses over the light receiving surfaces and condensing lights on the light receiving surfaces to suppress the fall of the sensitivity is known.

Japanese Patent Application Laid-Open No. 2004-186407 discloses the configuration of lessening the sizes from the on-chip micro lenses to the light receiving surfaces in their height directions in addition to the mounting of the on-chip micro lenses.

Figure 7:
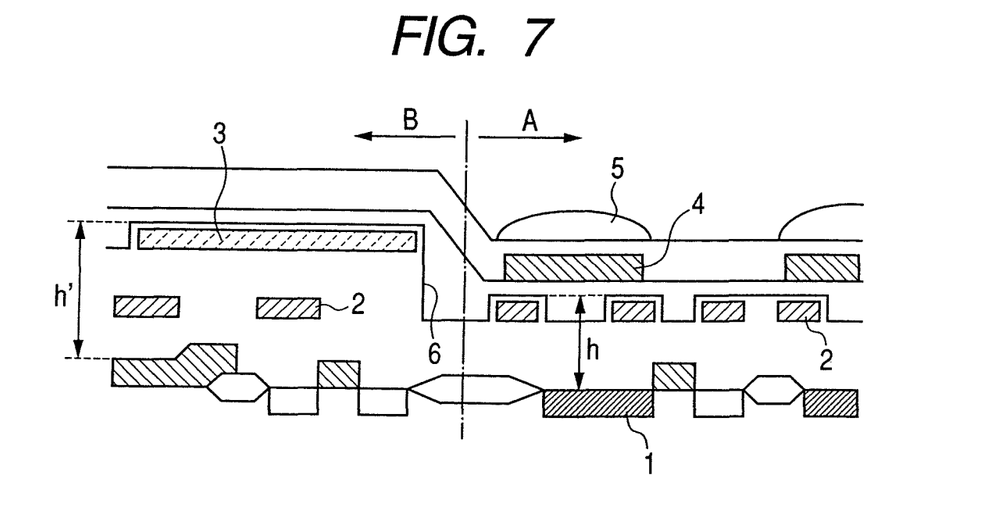
FIG. 7 is a sectional view illustrating a prior art solid-state imaging apparatus.

FIG. 7 shows the CMOS type solid-state imaging apparatus of Japanese Patent Application Laid-Open No. 2004-186407. An effective pixel region is arranged on the right side A of an alternate long and short dash line, in which effective pixel region a plurality of pixels is arranged. Each of the plurality of pixels includes a photoelectric conversion element performing a photoelectric conversion according to an incident light quantity. The region on the left side of the alternate long and short dash line is the region (hereinafter referred to as an out-of effective pixel region) other than the effective pixel region.

The CMOS type solid-state imaging apparatus includes photoelectric conversion regions 1, a first metal wiring 2, and a second metal wiring 3 as illustrated in FIG. 7. The on-chip micro lenses 5 are mounted over the first metal wiring 2 with a color filter 4 put between them. A step 6 is formed between the effective pixel region A and the out-of effective pixel region B. The second metal wiring 3, which is the uppermost wiring existing in the out-of effective pixel region B, does not exist in the effective pixel region A to lessen the distance h of the effective pixel region A from the light receiving surfaces in FIG. 7 (distance h<distance h' in FIG. 7).

If the step 6 in the solid-state imaging apparatus of FIG. 7 disperses in a surface of the solid-state imaging apparatus or among different solid-state imaging apparatus, then the sensitivity of the solid-state imaging apparatus sometimes disperses. In order to suppress the dispersion of the sensitivity, it is important to manufacture the solid-state imaging apparatus so that the distances between the interlayer lenses and the photoelectric conversion elements may be uniform in the effective pixel regions A. However, Japanese Patent Application Laid-Open No. 2004-186407 did not sufficient examination of the manufacturing method of the solid-state imaging apparatus illustrated in FIG. 7. Moreover, in order to further improve the condensing efficiency into the photoelectric conversion regions 1, it is required to further lessen the distances between the lenses 5 and the photoelectric conversion elements (to realize a low profile).

SUMMARY OF THE INVENTION

The present invention is directed to provide a more highly sensitive solid-state imaging apparatus and a manufacturing method of a solid-state imaging apparatus having high sensitivity and capable of reducing the dispersion of the sensitivity.

An aspect of the manufacturing method of a solid-state imaging apparatus of the present invention is a manufacturing method of a solid-state imaging apparatus comprising:

a first region in which a plurality of pixels each including a photoelectric conversion element are arranged;

a second region including a peripheral circuit for readout from the plurality of pixels;

an interlayer lens arranged above the photoelectric conversion element;

a color filter arranged above the interlayer lens; and a lens arranged above the color filter, wherein the method comprising steps of:

forming a first metal wiring layer at least on the first and second regions;

forming an etch stop layer on the first metal wiring layer;

forming a first insulating film on the etch stop layer;

forming, on the first insulating film in the second region, a second metal wiring layer different from the first metal wiring layer;

removing the first insulating film in the first region using the etch stop layer;

forming a second insulating film in the first region from which the first insulating film is removed, and in the second region; and forming the interlayer lens from the second insulating film in the first region.

Moreover, another aspect of the present invention is a solid-state imaging apparatus comprising:

a first region in which a plurality of pixels each including a photoelectric conversion element are arranged;

a second region including a peripheral circuit for readout from the plurality of pixels;

an interlayer lens arranged above the photoelectric conversion element;

a color filter arranged above the interlayer lens; and a lens arranged above the color filter, wherein the metal wiring layers arranged in the first region is in a smaller number than that in the second region, and the interlayer lens is formed between a metal wiring layer at most upper portion in the first region and a metal wiring layer at most upper portion in the second region, and within the first region.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE EMBODIMENTS

Next, the exemplary embodiments of the present invention will be described in detail with reference to the accompanying drawings. Incidentally, the present invention is not limited to the following exemplary embodiments.

(First Embodiment)

FIGS. 1A to 1D and FIGS. 2E to 2H are views for illustrating a manufacturing method of a solid-state imaging apparatus according to a first embodiment of the present invention. It is supposed in the manufacturing method of the present embodiment that the processing at the steps illustrated in FIGS. 1A to 1D continues to the processing at the steps illustrated in FIGS. 2E to 2H. In the drawings, reference characters A and B denote an effective pixel region (first region) and an out-of effective pixel region (second region) other than the effective pixel region A, respectively. The out-of effective pixel region B is supposed to include not only a peripheral circuit region but also an optical black region for forming a reference signal to effective pixels.

Moreover, the effective pixel region A indicates a region in which a plurality of pixels, each including a photoelectric conversion element, a circuit for reading out the signal of the photoelectric conversion element, and the like, is arranged in a matrix arrangement. The out-of effective pixel region B is arranged around the effective pixel region A. The peripheral circuits in the out-of effective pixel region B include a vertical scanning circuit and a horizontal scanning circuit, both for the driving of reading out signals of the pixels by scanning the pixels in row directions and column directions, circuits amplifying the signals of the pixels, and the like. The configurations of the effective pixel region A and the out-of effective pixel region B are the same in the following embodiments.

Moreover, the detailed descriptions of element regions, element isolation regions, and the like, formed on a semiconductor substrate (silicon substrate or the like), will be omitted for the sake of the simplification of the descriptions in the following embodiments. Furthermore, electric contacts and via plugs for electrically connecting metal wirings mutually are not illustrated. Furthermore, since conventional steps can be applied as the steps for forming color filters and on-chip micro lenses after the formation of interlayer lenses, the detailed descriptions of the steps will be omitted. The surfaces of the photoelectric conversion elements (the surfaces of a semiconductor substrate 100) are set as light receiving portions, and the upper direction of the solid-state imaging apparatus is set to the direction from the light receiving portions toward the on-chip micro lenses here. These suppositions are the same in the following embodiments.

In the present embodiment, the metal wirings in the out-of effective pixel region B are formed to be three layers, and the metal wirings in the effective pixel region A are formed to be two layers. First and second metal wiring layers from the lower layer side are made of copper wirings, and the third metal wiring layer at the uppermost part is made of an aluminum wiring. Moreover, as a film having an etching resistance property to a silicon oxide film in the effective pixel region A, a film made of an organic small dielectric constant material is used. Each metal wiring layer includes a plurality of metal wirings, and is formed on different insulating films.

Figure 1A:
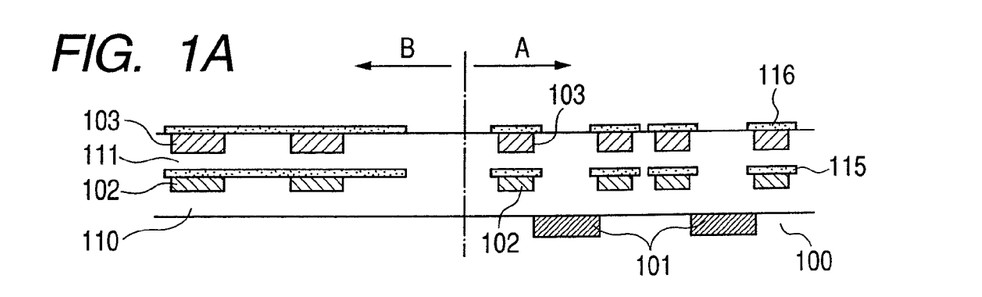
FIGS. 1A, 1B, 1C, and 1D are sectional views for illustrating a manufacturing method of a solid-state imaging apparatus according to a first embodiment of the present invention.

First, as illustrated in FIG. 1A, polysilicon, which becomes gate electrodes of transistors, is formed on the semiconductor substrate (silicon substrate or the like) 100 including semiconductor regions 101, each constituting a photoelectric conversion element. The polysilicon is not illustrated. Furthermore, a silicon oxide film is deposited on the polysilicon by, for example, the chemical vapor deposition (CVD) method, and after that, a first insulating film 110, which has been planarized by the chemical-mechanical polishing (CMP) method, is formed.

Next, a first metal wiring layer 102 made of copper is formed on the first insulating film 110 by the damascene method, and a first diffusion preventing film 115 is formed over the whole surface of the semiconductor substrate 100. After that, a pattern is formed by removing the first diffusion preventing film 115 over the light receiving portions (photoelectric conversion elements) by the lithography technique and the dry etching technique. Next, a second insulating film 111 made of a silicon oxide film is formed by, for example, the CVD method. If the influences caused by the steps of the first diffusion preventing film 115 are removed at the time of the formation of the second insulating film 111, then the planarizing may be performed by the CMP method.

Next, a second metal wiring layer 103 made of copper, which becomes the wiring at the uppermost part in the effective pixel region A, is formed by the damascene method. Moreover, a silicon nitride film is formed over the whole surface of the semiconductor substrate 100 by the CVD method, and after that, the pattern of a second diffusion preventing film 116 is formed by removing the parts above the light receiving portions by the lithography technique and the dry etching technique.

Figure 1B:
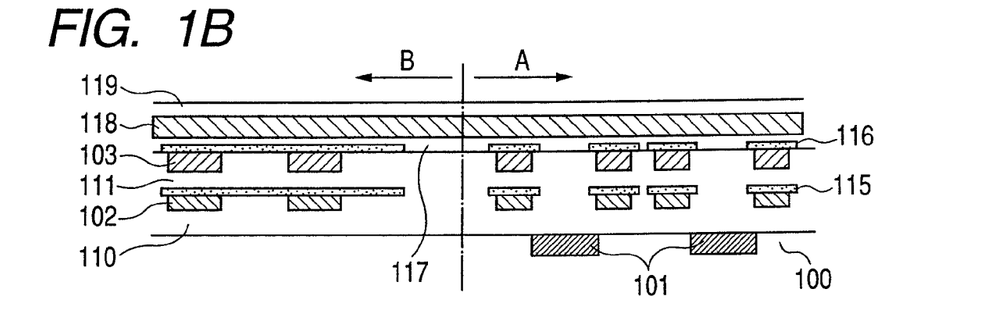

Next, as illustrated in FIG. 1B, in order that the steps caused by the second diffusion preventing film 116 may be buried, a silicon oxide film 117 is formed over the semiconductor substrate 100 as an insulating film by the CVD method, a coating method, or the like. In order to remove the influences of the steps by the second diffusion preventing film 116, the silicon oxide film 117 may be planarized by the CMP method.

Next, an organic small dielectric constant film 118 is applied over the semiconductor substrate 100, and is formed by being given a thermal treatment. As the organic small dielectric constant material, SiLK (registered trademark of The Dow Chemical Company) and the like are given. The organic small dielectric constant film 118 has a high etching resistance property to the etching to a silicon oxide film. After that, a silicon oxide film 119 is formed on the organic small dielectric constant film 118 by the CVD method or the coating method.

By the processing mentioned above, three insulating films of the silicon oxide film 117, the organic small dielectric constant film 118, and the silicon oxide film 119 are formed on the second diffusion preventing film 116 in this order.

Next, although the illustration thereof is omitted, by the heretofore known lithography technique and the dry etching technique, via holes are formed in the out-of effective pixel region B. That is, the via holes for electrically connecting the second metal wiring layer 103 and an aluminum third metal wiring layer 104, which will be formed later, to the silicon oxide film 119, the organic small dielectric constant film 118, the silicon oxide film 117, and the second diffusion preventing film 116 are formed. Successively, a barrier film layer made of a metal nitride film, and a metal film made of tungsten or the like are formed over the semiconductor substrate 100 by the sputtering method or the CVD method, and via holes are buried by means of a metal material. Furthermore, via plugs are formed by the planarizing of the metal film made of tungsten or the like by means of the CMP method.

Figure 1C:
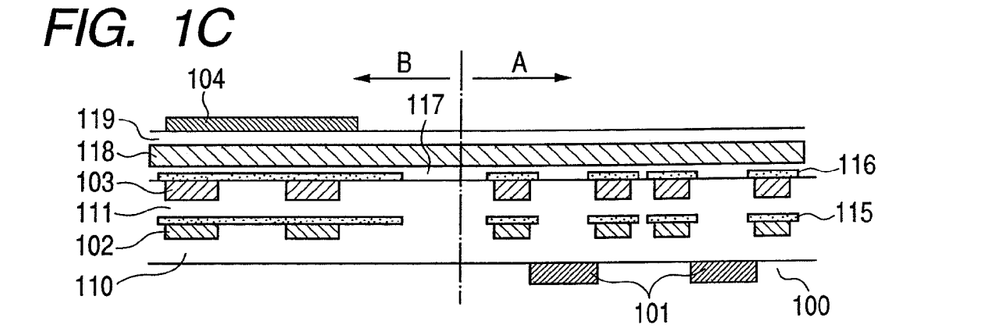

Next, as illustrated in FIG. 1C, an aluminum film made of aluminum or an aluminum alloy is formed over the semiconductor substrate 100 by the sputtering method or the CVD method, and the third metal wiring layer 104 is formed in the out-of effective pixel region B by the lithography technique and the dry etching technique. The aluminum film formed in the effective pixel region A is removed by the lithography technique or the dry etching technique, and then the silicon oxide film 119 is exposed. The third metal wiring layer 104 formed in the out-of effective pixel region B does not only function as a metal wiring in the peripheral circuit region, but also functions as a light blocking film in the optical black region.

Figure 1D:
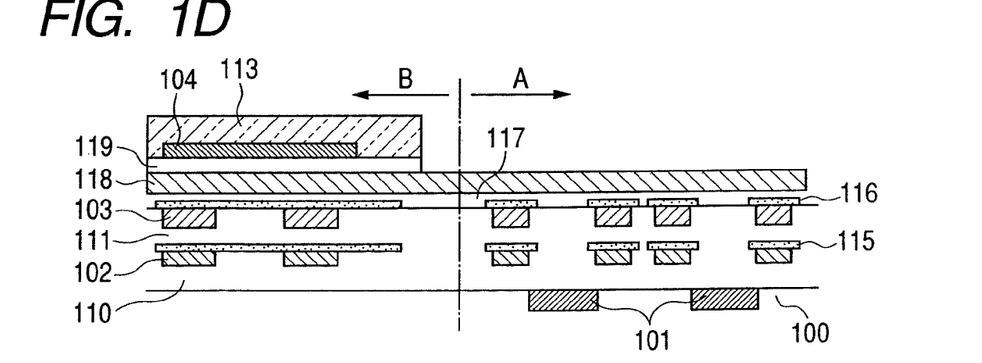

Next, as illustrated in FIG. 1D, the out-of effective pixel region B is masked with a photoresist 113 by the heretofore known lithography technique, and the silicon oxide film 119 in the effective pixel region A is processed by dry etching. The present etching stops at the organic small dielectric constant film 118, and the organic small dielectric constant film 118 is exposed in the effective pixel region A.

Figure 2E:
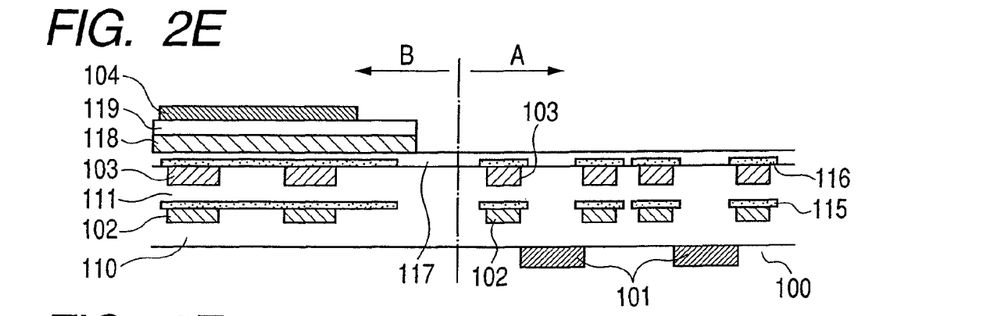
FIGS. 2E, 2F, 2G, and 2H are sectional views for illustrating the manufacturing method of the solid-state imaging apparatus according to the first embodiment of the present invention.

Next, the photoresist 113, which has been used at the time of the etching of the silicon oxide film 119, is removed by the heretofore known ashing technique or the exfoliating technique. On this occasion, as illustrated in FIG. 2E, the organic small dielectric constant film 118, which is exposed in the effective pixel region A, is simultaneously subjected to the ashing, and the silicon oxide film 117 at the lower layer of the organic small dielectric constant film 118 is exposed.

Figure 2F:
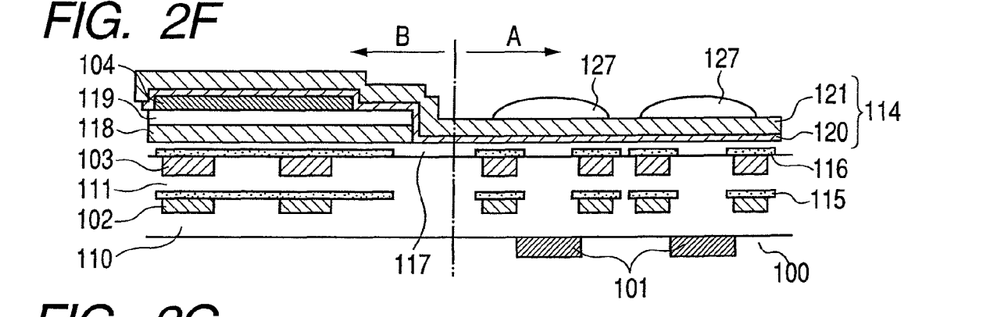

Moreover, as illustrated in FIG. 2F, an interlayer lens forming layer 114 is formed over the semiconductor substrate 100 by the CVD method. In the present embodiment, a silicon oxynitride film 120 and a silicon nitride film 121 are formed as the interlayer lens forming layer 114 by the CVD method. Next, a resist pattern 127 including convex semispherical islands is formed on the silicon nitride film 121 by the heretofore known lithography technique in order to form interlayer lenses 105.

Figure 2G:
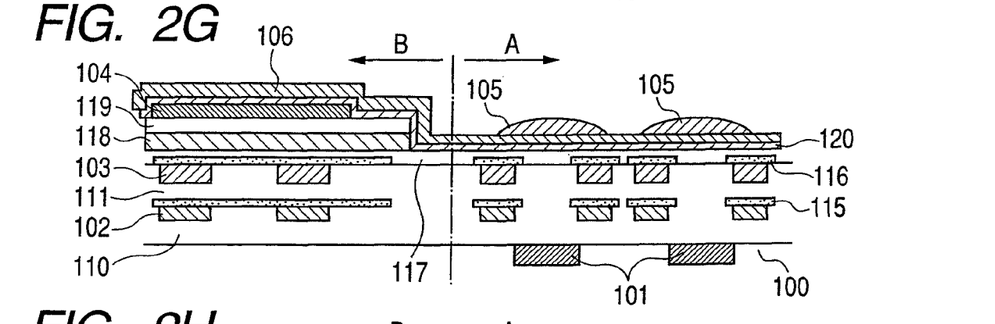
Figure 2H:
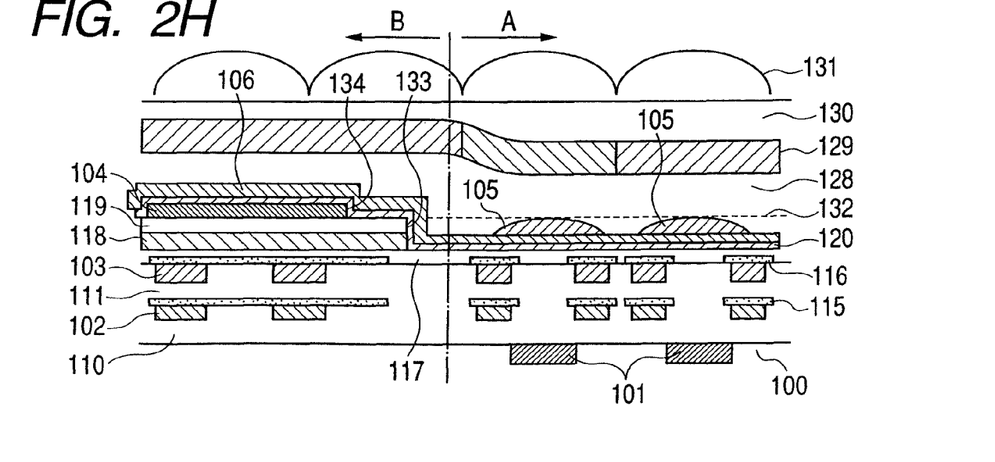

Next, etching is performed with the resist pattern 127 used as a mask, and the interlayer lenses 105 are formed as illustrated in FIG. 2G. Incidentally, the parts of the silicon nitride film 121 other than the interlayer lenses 105 become a passivation film 106 over the semiconductor substrate 100. Next, as illustrated in FIG. 2H, a planarizing layer 128 is formed over the effective pixel region A and the out-of effective pixel region B, and a color filter 129, a planarizing layer 130, and micro lenses 131 are formed over the planarizing layer 128. Although the illustration thereof is omitted, in the out-of effective pixel region B, especially in the peripheral circuit region, openings for pad portions are formed by the lithography technique and the dry etching technique.

In the present embodiment, all of the first insulating film 110, the second insulating film 111, and the silicon oxide film 117 for planarizing the steps owing to the second diffusion preventing film 116 arranged upward from the light receiving portions over the semiconductor regions 101 are silicon oxide films. Then, the silicon oxynitride film 120, and the silicon nitride film 121, from which the passivation film 106 and the interlayer lenses 105 are formed, are deposited as the upper layer of the silicon oxide film 117. The refractive indices of these films are as follows.

For example, to a light of a wavelength of 633 nm, the refractive indices of the silicon oxide films constituting the first insulating film 110, the second insulating film 111, and the silicon oxide film 117 for planarizing the steps are within a range of from 1.46 to 1.50; the refractive index of the silicon oxynitride film 120 is within a range of from 1.60 to 1.73; and the refractive index of the silicon nitride film 121 is 2.0. The relations among the refractive indices of these films are as follows: the refractive indices of the films are equal to the refractive indices of the light receiving surfaces of the semiconductor substrate 100 or gradually increase from the light receiving surfaces toward the interlayer lenses 105, and consequently the lights transmitted through the interlayer lenses 105 can be effectively collected to the semiconductor regions 101.

Moreover, in the present embodiment, the effective pixel region A and the out-of effective pixel region B have a mutually different number of wirings. Moreover, the organic small dielectric constant film 118, which is an etch stop layer, is provided between the wiring layer at the most upper portion in the effective pixel region A and the wiring layer at the most upper portion in the out-of effective pixel region B. Moreover, the silicon oxide film 119 in the effective pixel region A is removed, and further the etch stop layer in the effective pixel region A is removed. Hereby, the organic small dielectric constant film 118 can be removed from the optical paths of the photoelectric conversion elements in the effective pixel region A. Moreover, in the out-of effective pixel region B, the organic small dielectric constant film 118 is provided between the uppermost wiring layer and the wiring layer at the lower layer of the uppermost wiring layer. Consequently, the distance between the uppermost wiring layer and the wiring layer at the lower layer thereof can be shortened with the capacitive coupling between the wiring layers suppressed. Incidentally, the uppermost wiring layer in the out-of effective pixel region B is sometimes a wiring layer for supplying a power source voltage or for grounding. In this case, the influences of the noise of the capacitive coupling owing to the potential changes of the wiring layer at the lower layer can be reduced in comparison with those in the other cases. Consequently, the distance between the uppermost wiring layer and the wiring layer at the lower layer thereof in the out-of effective pixel region B can be also shortened.

As described above, a step is formed between the wiring at the most upper portion in the effective pixel region A and the wiring at the most upper portion in the out-of effective pixel region B (see FIG. 2E), and the interlayer lenses 105 are formed in the effective pixel region A by using the space formed by the step. Then, the formation of the interlayer lenses 105 in the effective pixel region A enables the further improvement of the condensing efficiency of the light receiving surface and the realization of a higher sensitivity solid-state imaging apparatus. Moreover, the formation of the interlayer lenses 105 and the passivation film 106 with the same film enables the lower profile of the solid-state imaging apparatus.

Moreover, after that, a planarizing layer covering the interlayer lenses 105 is sometimes provided over the effective pixel region A and the out-of effective pixel region B. At this time, if the interlayer lenses 105 are provided at the step, then the planarizing becomes easy, and the film thickness of the planarizing layer can be reduced.

The heights 132 of the interlayer lenses 105 can be equal to or less than that of the top surface of the uppermost wiring layer in the out-of effective pixel region B here. The above-mentioned heights of the interlayer lenses 105 make it easy to perform the planarizing of the planarizing layer after that.

Moreover, the position of the end faces 133 of the organic small dielectric constant film 118 and the silicon oxide film 119 located on the side closest to the effective pixel region A are different from the position of the end face 134 of the third metal wiring layer 104 located on the side closest to the effective pixel region A. In other words, at the boundary of the effective pixel region A and the out-of effective pixel region B, the organic small dielectric constant film 118 and the silicon oxide film 119 extend toward the effective pixel region A more than the degree of the extension of the third metal wiring layer 104 toward the effective pixel region A. The stepwise formation of the steps from the effective pixel region A toward the out-of effective pixel region B enables the reduction of the influences of the step from the effective pixel region A to the interlayer lens forming layer and the like formed in the out-of effective pixel region B.

Moreover, since the distance between the interlayer lenses 105 and the photoelectric conversion elements can be lessened and be made to be uniform in the effective pixel region A in conformity with the manufacturing method as the present embodiment, the dispersion of the sensitivity of the solid-state imaging apparatus can be reduced. Also in the following embodiments, the condensing efficiency of a light receiving surface can be similarly further improved, and higher sensitivity can be realized. Furthermore, the dispersion of the sensitivity can be reduced.

Incidentally, although the description thereof is omitted, it offers no problem to form the first metal wiring layers 102 and the second metal wiring layer 103, both made of copper, by means of either the single damascene method or the dual damascene method. Moreover, the qualities of the materials of the metal wirings are not limited to those of the present embodiment, but all of the metal wirings may be the ones made of aluminum or copper.

Furthermore, the numbers of the metal wiring layers in the effective pixel region A and the out-of effective pixel region B are not limited to those shown in the present embodiment as long as the number of the metal wiring layers in the effective pixel region A satisfies the condition to be smaller than the number of the metal wiring layers in the out-of effective pixel region B. For example, in the out-of effective pixel region B, a third metal wiring layer may be provided between the first metal wiring layers 102 and the second metal wiring layer 103.

Moreover, in the present embodiment, the film composed of the three insulating films of the silicon oxide film 117, the organic small dielectric constant film 118, and the silicon oxide film 119 is formed over the semiconductor substrate 100 after the formation of the second diffusion preventing film 116. If there is no problem concerning the adhesion properties of the second diffusion preventing film 116 and the organic small dielectric constant film 118 between them, then the silicon oxide film 117 may be omitted.

Furthermore, although the silicon oxynitride film 120 and the silicon nitride film 121 are formed as the interlayer lens forming layer 114 in order to form the interlayer lenses 105 of the present embodiment, the number and the qualities of materials of the films of the interlayer lens forming layer 114 are not limited to those of the silicon oxynitride film 120 and the silicon nitride film 121. However, the refractive indices of those films desirably satisfy the above-mentioned relation in order to reduce the losses owing to the reflections of the lights transmitted by the interlayer lenses 105 on each of the films.

Moreover, optical waveguides, each composed of a high refractive index material and a low refractive index material, may be arranged between the photoelectric conversion elements and the interlayer lenses 105 in the solid-state imaging apparatus of the present embodiment. By the shortening of the distances between the interlayer lenses 105 and the photoelectric conversion elements, it becomes necessary to adjust the focus positions of the interlayer lenses 105. However, the provision of the optical waveguides in the wiring layers enables the more effective guidance of lights condensed in the interlayer lenses 105 to the photoelectric conversion elements.

(Second Embodiment)

FIGS. 3A to 3D and FIGS. 4E to 4H are views for illustrating a manufacturing method of a solid-state imaging apparatus according to a second embodiment of the present invention. It is supposed that the processing of the manufacturing method of the present embodiment continues from the processing at the steps illustrated in FIGS. 3A to 3D to that at the steps illustrated in FIGS. 4E to 4H.

Figure 3A:
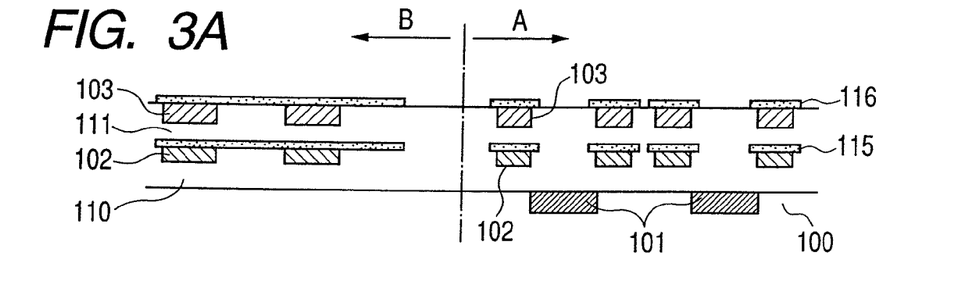
FIGS. 3A, 3B, 3C, and 3D are sectional views for illustrating a manufacturing method of a solid-state imaging apparatus according to a second embodiment of the present invention.

Moreover, the detailed descriptions of the configurations having the same functions as those of the first embodiment are omitted. In FIGS. 3A to 3D and FIGS. 4E to 4H, the same parts as those in FIGS. 1A to 1D and FIGS. 2E to 2H are denoted by the same reference characters as those of FIGS. 1A to 1D and FIGS. 2E to 2H, and the descriptions of the parts are omitted. FIG. 3A is similar to FIG. 1A, and the description of FIG. 3A is omitted.

Figure 3B:
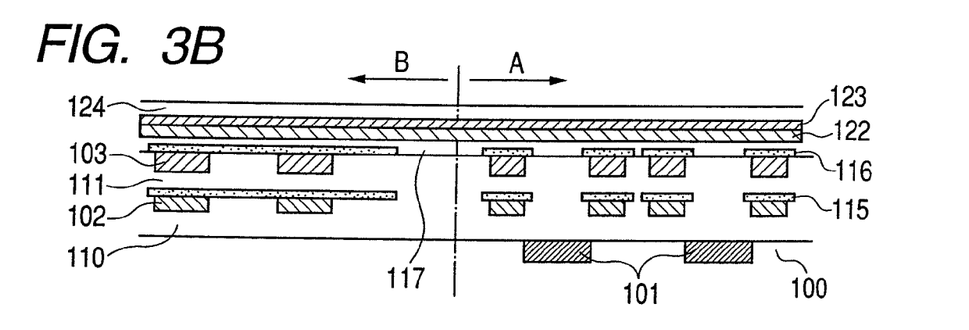

After the processing of FIG. 3A, as illustrated in FIG. 3B, the silicon oxide film 117, which is an insulating film, is formed over the semiconductor substrate 100 by the CVD method, the coating method, or the like, so that the steps owing to the second diffusion preventing film 116 may be buried. In order to remove the influences of the steps by the second diffusion preventing film 116, the silicon oxide film 117 may be planarized by the CMP method.

Next, a silicon oxynitride film 122 is formed over the semiconductor substrate 100 by the CVD method, and further a silicon nitride film 123 is formed by the CVD method or the like. The silicon nitride film 123 has an etching resistance property to the etching of a silicon oxide film. After that, a silicon oxide film 124 is formed on the silicon nitride film 123 by the CVD method or the coating method.

By the above-mentioned processing, the four insulating films of the silicon oxide film 117, the silicon oxynitride film 122, the silicon nitride film 123, and the silicon oxide film 124 are formed over the semiconductor substrate 100 so as to cover the second diffusion preventing film 116. Incidentally, the formation method of the via plugs for electrically connecting the second metal wiring layer 103 to the third metal wiring layer 104 is similar to the one described with regard to the first embodiment.

Figure 3C:
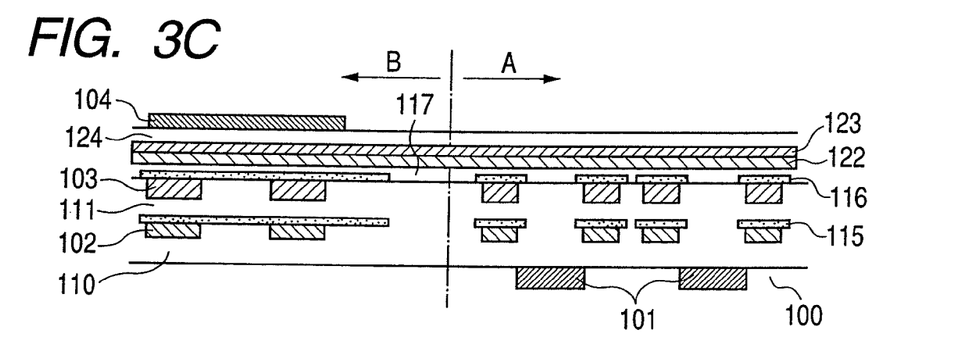

Next, as illustrated in FIG. 3C, an aluminum film made of aluminum or an aluminum alloy is formed over the semiconductor substrate 100 by the sputtering method or the CVD method, and the third metal wiring layer 104 is formed in the out-of effective pixel region B by the lithography technique or the dry etching technique. The aluminum film formed in the effective pixel region A is removed by the lithography technique or the dry etching technique, and the silicon oxide film 124 is exposed. The third metal wiring layer 104 formed in the out-of effective pixel region B is not only the metal wiring in the peripheral circuit regions, but also functions as the light blocking films in the optical black regions.

Figure 3D:
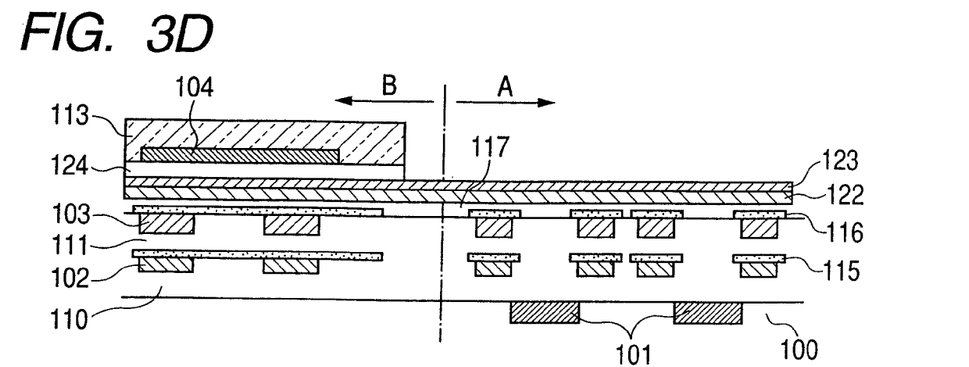

Moreover, as illustrated in FIG. 3D, the out-of effective pixel region B is masked with the photoresist 113 by the heretofore known lithography technique, and the silicon oxide film 124 in the effective pixel region A is subjected to dry etching. The present etching is stopped at the silicon nitride film 123, and the silicon nitride film 123 is exposed in the effective pixel region A.

Figure 4E:
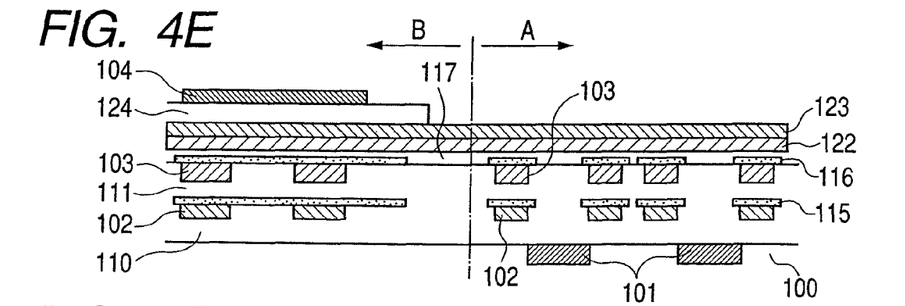
FIGS. 4E, 4F, 4G, and 4H are sectional views for illustrating the manufacturing method of the solid-state imaging apparatus according to the second embodiment of the present invention.

Next, the photoresist 113 used at the time of the etching of the silicon oxide film 124 is removed by the heretofore known ashing technique or the exfoliating technique. In this case, as illustrated in FIG. 4E, the silicon nitride film 123 exposed in the effective pixel region A is not influenced by the ashing or the like unlike in the case of the first embodiment.

Figure 4F:
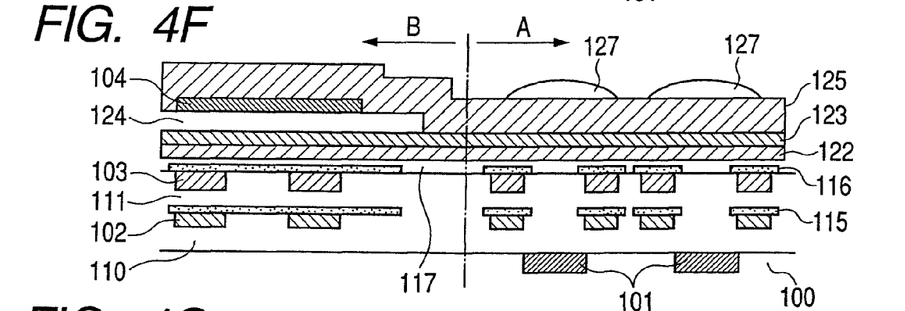

Next, as illustrated in FIG. 4F, an interlayer lens forming layer 125 is formed over the semiconductor substrate 100 by the CVD method. In the present embodiment, a silicon nitride film is formed by the CVD method. Next, in order to form the interlayer lenses 105, the resist pattern 127 including upward convex semispherical islands is formed in the silicon nitride film by the heretofore known lithography technique.

Figure 4G:
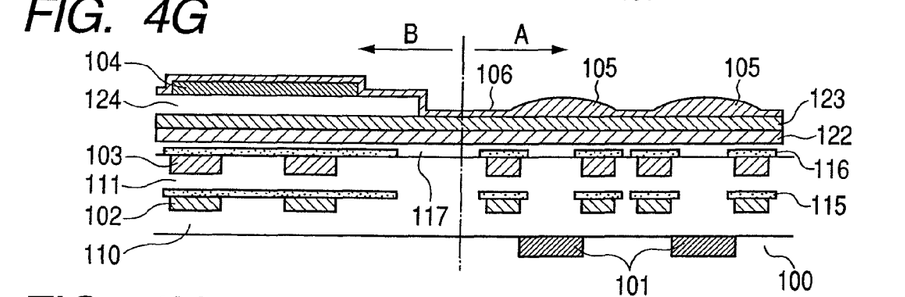

Next, the interlayer lenses 105 are formed by etching the silicon nitride film with the resist pattern 127 used as a mask as illustrated in FIG. 4G. Incidentally, the parts of the silicon nitride film, which is the interlayer lens forming layer 125, other than the interlayer lenses 105 become the passivation film 106 of the semiconductor substrate 100. Moreover, in the etching for forming the interlayer lenses 105, the etching may be performed up to the silicon nitride film 123 to form the interlayer lenses 105 with the interlayer lens forming layer 125 and the silicon nitride film 123.

Figure 4H:
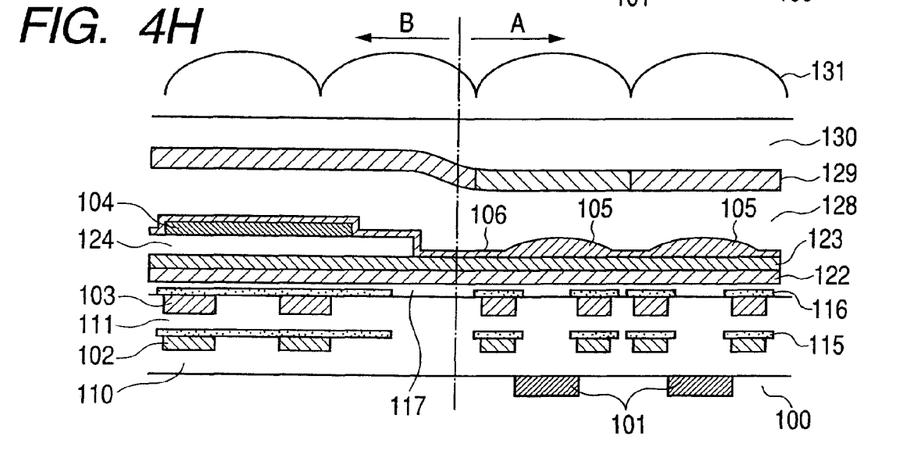

Next, similarly in the first embodiment, as illustrated in FIG. 4H, the planarizing layer 128 is formed over the effective pixel region A and the out-of effective pixel region B, and the color filter 129, the planarizing layer 130, and the micro lenses 131 are formed over the planarizing layer 128.

In the present embodiment, the planarizing film is the silicon oxide film 117 in the semiconductor regions 101. Moreover, over the silicon oxide film 117, the silicon oxynitride film 122, the silicon nitride film 123, which has an etching resistance property to a silicon oxide film, and a silicon nitride film 125 for forming the passivation film 106 and the interlayer lenses 105 are deposited.

The refractive indices of these films are as follows. For example, to a light of a wavelength of 633 nm, the refractive index of the silicon oxide film 117 is within a range of from 1.46 to 1.50; the refractive index of the silicon oxynitride film 122 is within a range of from 1.60 to 1.73; and the refractive index of the silicon nitride film 125 is 2.0. The silicon oxynitride film 122 has the refractive index between the refractive indices of the silicon oxide film 117 and the silicon nitride film 125, and consequently the silicon oxynitride film 122 fills the role of a reflection preventing film. Thereby, lights can be effectively condensed.

Moreover, in the present embodiment, the number of the wiring layers in the effective pixel region A is different from that in the out-of effective pixel region B similarly to the first embodiment. Moreover, the silicon nitride film 123, which is the etch stop layer, is provided between the uppermost wiring layer in the effective pixel region A and the uppermost wiring layer in the out-of effective pixel region B, and the silicon oxide film 124 in the effective pixel region A is removed. In this way, a step is formed between the effective pixel region A and the out-of effective pixel region B (see FIG. 4E), and the interlayer lenses 105 are formed in the effective pixel region A by using the space produced by the step.

Incidentally, similarly to the first embodiment, the materials of the metal wiring layers and the numbers of the metal wiring layers are not limited to those shown in the present embodiment. Moreover, in the present embodiment, the four layers of the insulating films of the silicon oxide film 117, the silicon oxynitride film 122, the silicon nitride film 123, and the silicon oxide film 124 are formed over the semiconductor substrate 100 after the formation of the second diffusion preventing film 116. At that time, the silicon nitride film 123 may be formed directly on the second diffusion preventing film 116 or may be formed over the second diffusion preventing film 116 after the formation of the silicon oxynitride film 122 thereon.

Furthermore, although the silicon nitride film is formed as the interlayer lens forming layer 125 in order to form the interlayer lenses 105, the number of the qualities of the materials of the film and the qualities of the materials of the interlayer lens forming layer 125 are not limited to those mentioned above. However, the refractive index of each of those films is required to satisfy the above-mentioned relation in order to efficiently collect the lights transmitted through the interlayer lenses 105 to the semiconductor regions 101. That is, as described above, the refractive index of the silicon oxynitride film 122 is desirably the one between the refractive indices of the silicon oxide film 117 and the silicon nitride film 125.

(Third Embodiment)

FIGS. 5B to 5D and FIGS. 6E to 6H are views for illustrating a manufacturing method of a solid-state imaging apparatus according to a third embodiment of the present invention. It is supposed that the processing of the manufacturing method according to the present embodiment continues from those at the steps of FIGS. 5B-5D to those at the steps of FIGS. 6E to 6H. Moreover, the detailed descriptions of the configurations and steps of the same functions as those of the first and second embodiments are omitted. In FIGS. 5B to 5D and FIGS. 6E to 6H, the same parts as those of FIGS. 1A to 1D and FIGS. 2E to 2H, or FIGS. 3A to 3D and FIGS. 4E to 4H are denoted by the same characters as those in the first and second embodiments, and the descriptions of the same parts are omitted.

In the present embodiment, the metal wirings in the out-of effective pixel region B are composed of three layers, and the metal wirings in the effective pixel region A are composed of two layers similarly in the first and second embodiments. The first and second metal wiring layers from the lower layer side are copper wirings, and the third metal wiring layer at the uppermost part is an aluminum wiring. Moreover, an insulating film made of a silicon nitride material, which insulating film functions as a diffusion preventing film, is used as a film having an etching resistance property as a silicon oxide film in the effective pixel region A.

Figure 5B:
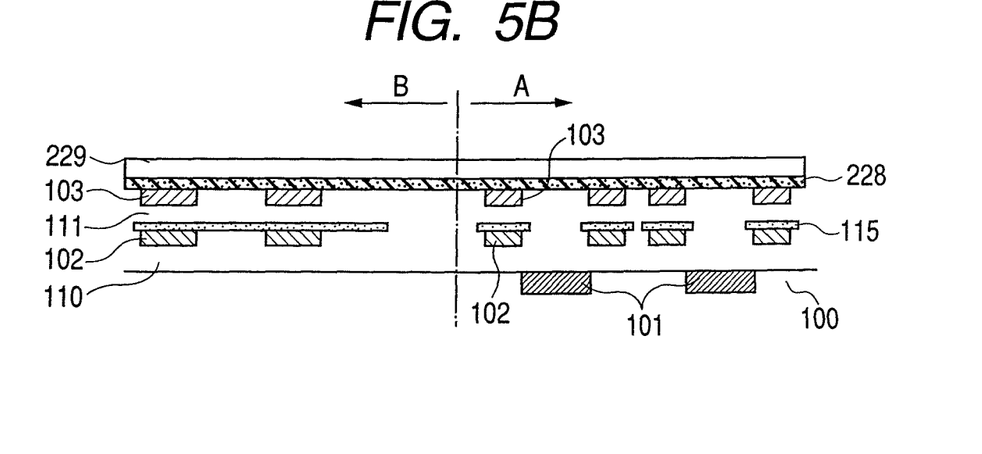
FIGS. 5B, 5C, and 5D are sectional views for illustrating a manufacturing method of a solid-state imaging apparatus according to a third embodiment of the present invention.

First, since the processing up to the step of FIG. 5B can be performed as illustrated in FIG. 1A, the description of the processing is omitted. That is, the manufacturing steps of the present embodiment continue from the step of FIG. 1A to the step of FIG. 5B.

After the processing at the step of FIG. 1A, as illustrated in FIG. 5B, a silicon nitride film 228 is formed on the second metal wiring layer 103, and a silicon oxide film 229, which is an insulating film, is formed on the silicon nitride film 228 by the CVD method, the coating method, or the like. Hereby, the insulating films of the two layers of the silicon nitride film 228 and the silicon oxide film 229 are formed over the semiconductor substrate 100 so as to cover the second metal wiring layer 103 made of copper. The silicon nitride film 228 can function as a diffusion preventing film for suppressing the diffusion of the metal in the second metal wiring layer 103. Incidentally, the formation method of the via plugs for electrically connecting the second metal wiring layer 103 to the third metal wiring layer 104 is the same as the method described related to the first embodiment.

Figure 5C:
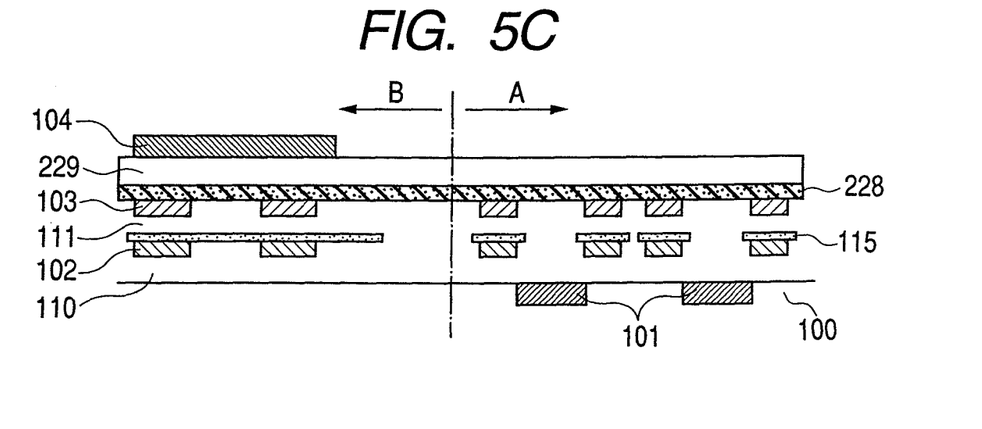

Next, as illustrated in FIG. 5C, an aluminum film made of aluminum or an aluminum alloy is formed over the semiconductor substrate 100 by the sputtering method or the CVD method, and the third metal wiring layer 104 is formed in the out-of effective pixel region B by the lithography technique or the dry etching technique. The aluminum film formed in the effective pixel region A is removed by the lithography technique or the dry etching technique, and the silicon oxide film 229 is exposed. Incidentally, the third metal wiring layer 104 formed in the out-of effective pixel region B does not become only as a metal wiring in the peripheral circuit regions, but also functions as a light blocking film in the optical black regions.

Figure 5D:
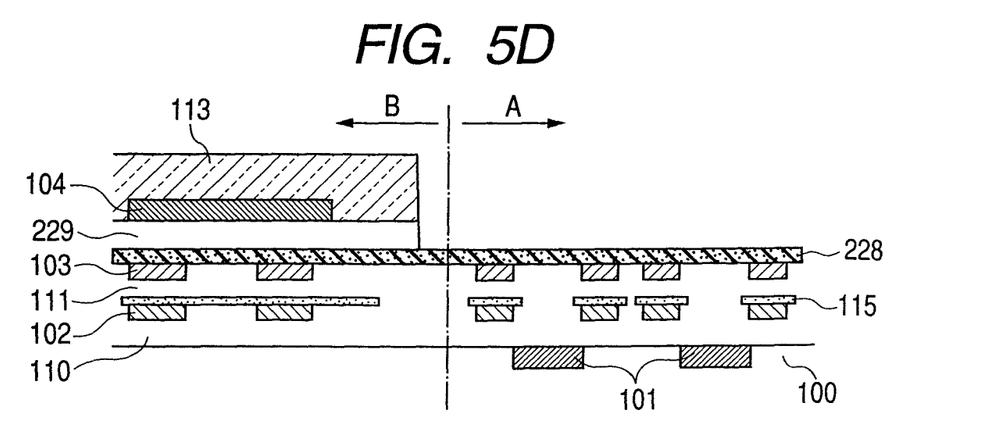

Next, as illustrated in FIG. 5D, the out-of effective pixel region B is masked with the photoresist 113 by the heretofore known lithography technique, and the silicon oxide film 229 in the effective pixel region A is etched. The etching stops at the silicon nitride film 228, and the silicon nitride film 228 is exposed in the effective pixel region A.

Figure 6E:
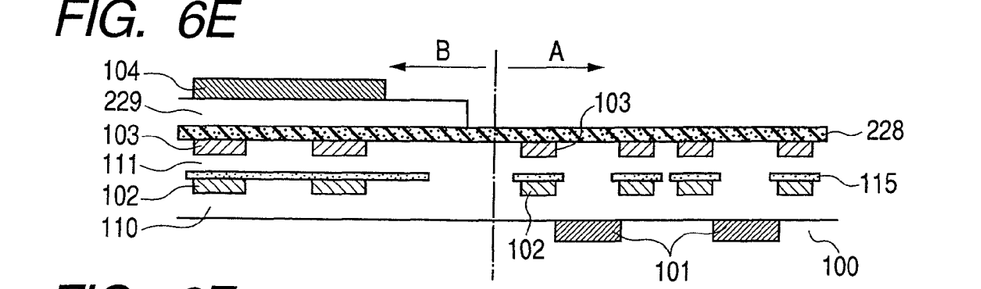
FIGS. 6E, 6F, 6G, and 6H are sectional views for illustrating the manufacturing method of the solid-state imaging apparatus according to the third embodiment of the present invention.

Next, the photoresist 113 used at the time of the etching of the silicon oxide film 229 is removed by the heretofore known ashing technique or the exfoliating technique. In this case, as illustrated in FIG. 6E, the silicon nitride film 228 exposed in the effective pixel region A is not influenced by the ashing or the like unlike in the first embodiment.

Figure 6F:
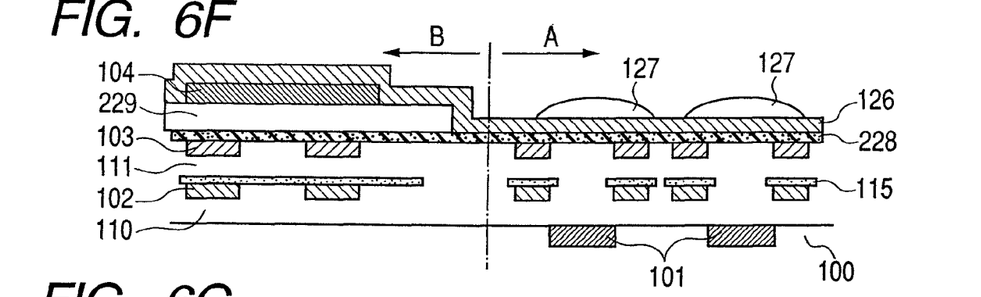

Moreover, as illustrated in FIG. 6F, an interlayer lens forming layer 126 is formed over the semiconductor substrate 100 by the CVD method. In the present embodiment, a silicon nitride film is formed by the CVD method as the interlayer lens forming layer 126. Next, the resist pattern 127 including upward convex semispherical islands is formed by the heretofore known lithography technique on the interlayer lens forming layer 126 in order to form the interlayer lenses 105.

Figure 6G:
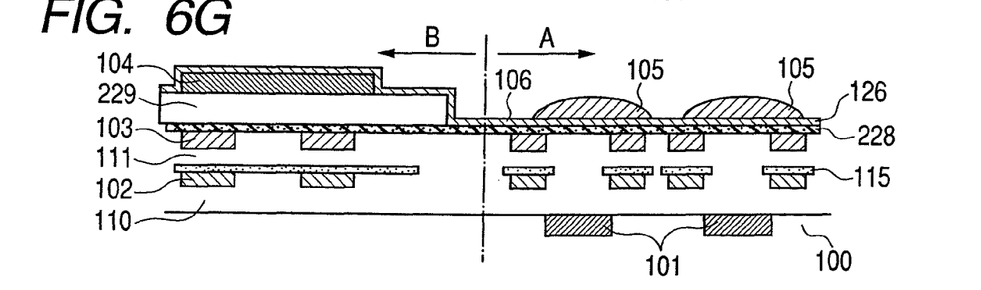

Next, etching is performed to the silicon nitride film with the resist pattern 127 used as a mask, and the interlayer lenses 105 are formed as illustrated in FIG. 6G.

Incidentally, the pars of the silicon nitride film, which is the interlayer lens forming layer 126, other than the interlayer lenses 105 become the passivation film 106 over the semiconductor substrate 100. Moreover, the etching for forming the interlayer lenses 105 may be performed up to the silicon nitride film 123, and the interlayer lens forming layer 125 and the silicon nitride film 123 may form the interlayer lenses 105.

Figure 6H:
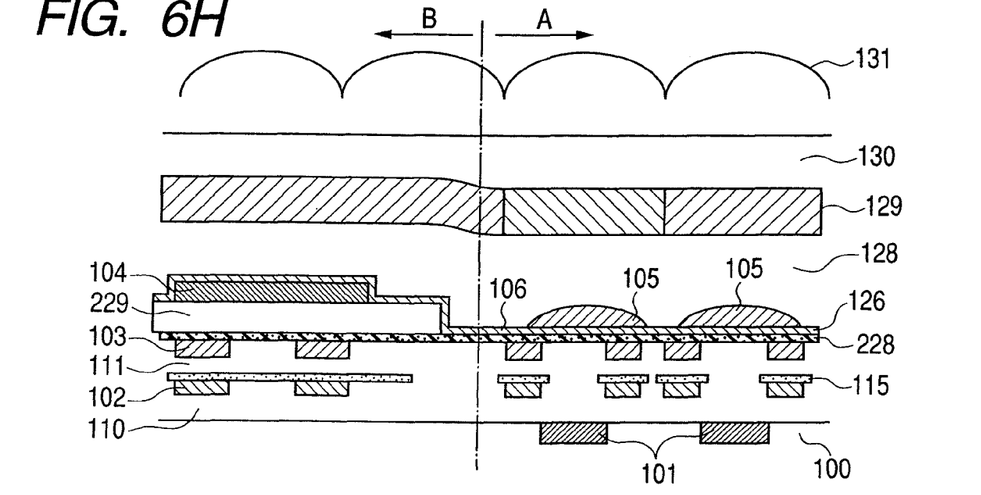

Next, similarly to the first and second embodiments, the planarizing layer 128 is formed over the effective pixel region A and the out-of effective pixel region B, and the color filter 129, the planarizing layer 130, and the micro lenses 131 are formed over the planarizing layer 128 (see FIG. 6H).

In the present embodiment, both of the first insulating film 110 and the second insulating film 111 in the semiconductor regions 101 upward from the light receiving portions are silicon oxide films. The silicon nitride film 228 as an etch stop layer and the interlayer lens forming layer 126 for forming the passivation film 106 and the interlayer lenses 105 are deposited over the second insulating film 111.

The refractive indices of these films are as follows. For example, to a light of the wavelength of 633 nm, the refractive indices of the silicon oxide films are within a range of from 1.46 to 1.50; the refractive index of the silicon oxynitride film is within a range of from 1.60 to 1.73; and the index of the silicon nitride film 228 is 2.0. The relation of the refractive indices of these films are set to be equal to the refractive indices of the light receiving surfaces of the semiconductor substrate 100 or to gradually increase from the refractive indices of the light receiving surfaces toward the side of the interlayer lenses 105. Thereby, the lights transmitted through the interlayer lenses 105 can be effectively condensed to the semiconductor regions 101.

Moreover, in the present embodiment, similarly to the second embodiment, the number of the wiring layers in the effective pixel region A is different from that in the out-of effective pixel region B. Moreover, the silicon nitride film 228, which is the etch stop layer, is provided between the uppermost wiring layer in the effective pixel region A and the uppermost wiring layer in the out-of effective pixel region B, and the silicon oxide film 229 in the effective pixel region A is removed. In this way, a step is formed between the effective pixel region A and the out-of effective pixel region B (see FIG. 6E), and the interlayer lenses 105 are formed in the effective pixel region A by using the space produced by the step. According to the circumstances, the third metal wiring layer 104 may be formed on the silicon nitride film 228 without providing the silicon oxide film 229 between them.

As described above, according to the present invention, the interlayer lenses 105 are formed in the step in the effective pixel region A, and consequently the condensing efficiency of the light receiving surfaces can be improved to enable the realization of the higher sensitivity solid-state imaging apparatus. Moreover, the distances between the interlayer lenses 105 and the light receiving surfaces are short, and the uniformity thereof in the effective pixel region A is high. Furthermore, the solid-state imaging apparatus has a high sensitivity to enable the reduction of the dispersion of the sensitivity thereof.

Incidentally, the forming method of the openings in the passivation film 106 in FIG. 6G are the same as the ones described with regard to the first and second embodiments. Moreover, the forming method and the qualities of materials of the metal wirings are the same as those of the first and second embodiments. Furthermore, the qualities of the materials of the interlayer lenses 105 of the first and second embodiments can be applied to that of the third embodiment.

The solid-state imaging apparatus of each of the embodiments described above can constitute an imaging system of a digital still camera, a digital camcorder, or the like together with an optical system, such as a lens and a diaphragm, an image processing circuit, a control circuit, a memory, and the like. Moreover, the configuration of each of the embodiments can be suitably combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-098166, filed Apr. 4, 2008, which is hereby incorporated by reference herein in its entirety.

What is claimed is:

1. A manufacturing method of a solid-state imaging apparatus including a first region in which a plurality of pixels each including a photoelectric conversion element are arranged, a second region including a peripheral circuit for readout from the plurality of pixels, an interlayer lens arranged above the photoelectric conversion elements, a color filter arranged above the interlayer lens, and a lens arranged above the color filter, the method comprising:
preparing a first metal wiring layer, an insulating film, an etch stop layer, a first insulating film, and a second metal wiring layer, wherein the first metal wiring layer, the insulating film, the etch stop layer, the first insulating film, and the second metal wiring layer are layered in this order, and wherein the second wiring layer is provided on the first insulating film in the second region;
removing the first insulating film in the first region using the etch stop layer until the etch stop layer is exposed;
after the removing of the first insulating film, forming a second insulating film in the first region and in the second region; and
forming the interlayer lens in the first region by processing the second insulating film.

2. The manufacturing method according to claim 1, wherein
the etch stop layer is an organic film having a low dielectric constant.

3. The manufacturing method according to claim 2, wherein
during the removing of the first insulating film in the first region, the first insulating film is removed using a photoresist as a mask, and
the method further includes removing the etch stop layer with the photoresist.

4. The manufacturing method according to claim 1, wherein
the etch stop layer is made of a silicon nitride film.

5. The manufacturing method according to claim 1, wherein,
between a light receiving surface of the photoelectric conversion elements and the interlayer lens, a portion having a plurality of insulating films including the insulating film is formed, and
the portion has a substantially same refractive index or a refractive index gradually increasing from the light receiving surface of the photoelectric conversion elements to the interlayer lens.

6. The manufacturing method according to claim 1, further comprising forming a third metal wiring layer on the second region and between the first and second metal wiring layers.

7. The manufacturing method according to claim 1, wherein during the forming of the interlayer lens, a part of the second insulating film comprises a passivation film.

8. The manufacturing method according to claim 1, wherein
the second region includes an optical black region, and
after the removing of the first insulating film, an edge of the first insulating film in the second region is closer to the first region than an edge of the second metal wiring layer.

9. A manufacturing method of a solid-state imaging apparatus including a first region in which a plurality of pixels each including a photoelectric conversion element are arranged, a second region including a peripheral circuit for readout from the plurality of pixels, an interlayer lens arranged above the photoelectric conversion elements, a color filter arranged above the interlayer lens, and a lens arranged above the color filter, the method comprising:
preparing a first metal wiring layer, an etch stop layer, a first insulating film, and a second metal wiring layer, wherein the first metal wiring layer, the etch stop layer, the first insulating film, and the second metal wiring layer are layered in this order, and wherein the second wiring layer is provided on the first insulating film in the second region;
removing the first insulating film in the first region until the etch stop layer is exposed;
after the removing of the first insulating film, forming a second insulating film in the first region and in the second region; and
forming the interlayer lens in the first region by processing the second insulating film,
wherein the etch stop layer is made of an organic film having a low dielectric constant.

10. The manufacturing method according to claim 9, wherein
during the removing of the first insulating film in the first region, the first insulating film is removed using a photoresist as a mask, and
the method further includes removing the etch stop layer with the photoresist.

* * * * *